United States Patent [19]

Foo et al.

[11] Patent Number: 5,017,872
[45] Date of Patent: May 21, 1991

[54] NMR RADIO FREQUENCY COIL WITH DIELECTRIC LOADING FOR IMPROVED FIELD HOMOGENEITY

[75] Inventors: Thomas K. Foo, Pewaukee; Cecil E. Hayes, Wauwatosa, both of Wis.; Yoon-Won Kang, Plainsboro, N.J.

[73] Assignee: General Electric Company, Milwaukee, Wis.

[21] Appl. No.: 467,475

[22] Filed: Jan. 19, 1990

[51] Int. Cl.$^5$ ............................................. G01R 33/20
[52] U.S. Cl. ..................................... 324/322; 324/318
[58] Field of Search ............... 324/300, 318, 322, 316, 324/319, 320, 313, 314; 128/653 SC; 333/239; 336/84 C

[56] References Cited

U.S. PATENT DOCUMENTS

| | | | |
|---|---|---|---|
| 4,506,224 | 3/1985 | Krause | 324/319 |
| 4,680,548 | 7/1987 | Edelstein et al. | 324/318 |
| 4,799,016 | 1/1989 | Rezvani | 324/318 |
| 4,887,039 | 12/1989 | Roemer et al. | 324/318 |

OTHER PUBLICATIONS

Glover et al., "Comparison of Linear and Circular Polarization for Magnetic Resonance Imaging", *Journal of Magnetic Resonance* 64, 255-270 (1985).

*Primary Examiner*—Michael J. Tokar
*Attorney, Agent, or Firm*—Quarles & Brady

[57] ABSTRACT

An RF coil assembly for an NMR instrument includes a cylindrical coil surrounded by a cylindrical shield. The annular space between the coil and the shield is filled with a dielectric material having a relative permittivity selected to improve the RF field homogeneity in the radial direction.

4 Claims, 3 Drawing Sheets

NMR RADIO FREQUENCY COIL WITH DIELECTRIC LOADING FOR IMPROVED FIELD HOMOGENEITY

BACKGROUND OF THE INVENTION

This invention relates to nuclear magnetic resonance (NMR) apparatus. More specifically, this invention relates to radio frequency (RF) coils useful with such apparatus for transmitting and/or receiving RF signals.

In the past, the NMR phenomenon has been utilized by structural chemists to study, in vitro, the molecular structure of organic molecules. Typically, NMR spectrometers utilized for this purpose were designed to accommodate relatively small samples of the substance to be studied. More recently, however, NMR has been developed into an imaging modality utilized to obtain images of anatomical features of live human subjects, for example. Such images depicting parameters associated with nuclear spins (typically hydrogen protons associated with water in tissue) may be of medical diagnostic value in determining the state of health of tissue in the region examined. NMR techniques have also been extended to in vivo spectroscopy of such elements as phosphorus and carbon, for example, providing researchers with the tools, for the first time, to study chemical processes in a living organism. The use of NMR to produce images and spectroscopic studies of the human body has necessitated the use of specifically designed system components, such as the magnet, gradient and RF coils.

By way of background, the nuclear magnetic resonance phenomenon occurs in atomic nuclei having an odd number of protons or neutrons. Due to the spin of the protons and neutrons, each such nucleus exhibits a magnetic moment, such that, when a sample composed of such nuclei is placed in a static, homogeneous magnetic field, $B_o$, a greater number of nuclear magnetic moments align with the field to produce a net macroscopic magnetization M in the direction of the field. Under the influence of the magnetic field $B_o$, the aligned magnetic moments precess about the axis of the field at a frequency which is dependent on the strength of the applied magnetic field and on the characteristics of the nuclei. The angular precession frequency, $\omega$, also referred to as the Larmor frequency, is given by the Larmor equation $\omega = \gamma B$ in which $\gamma$ is the gyromagnetic ratio (which is constant for each NMR isotope) and wherein B is the magnetic field ($B_o$ plus other fields) acting upon the nuclear spins. It will be thus apparent that the resonant frequency is dependent on the strength of the magnetic field in which the sample is positioned.

The orientation of magnetization M, normally directed along the magnetic field $B_o$, may be perturbed by the application of magnetic fields oscillation at or near the Larmor frequency. Typically, such magnetic fields designated $B_1$ are applied orthogonal to the direction of the $B_o$ field by means of RF pulses through a coil connected to a radio-frequency-transmitting apparatus. Under the influence of RF excitation, magnetization M rotates about the direction of the $B_1$ field. In NMR studies, it is typically desired to apply RF pulses of sufficient magnitude and duration to rotate magnetization M into a plane perpendicular to the direction of the $B_o$ field. This plane is commonly referred to as the transverse plane. Upon cessation of the RF excitation, the nuclear moments rotated into the transverse plane precess around the direction of the static field. The vector sum of the spins forms a precessing bulk magnetization which can be sensed by an RF coil. The signals sensed by the RF coil, termed NMR signals, are characteristic of the magnetic field and of the particular chemical environment in which the nuclei are situated. In NMR imaging applications, the NMR signals are observed in the presence of magnetic-field gradients which are utilized to encode spatial information into the signals. This information is later used to reconstruct images of the object studied in a manner well-known to those skilled in the art.

In performing whole-body NMR studies, it has been found advantageous to increase the strength of the homogeneous magnetic field $B_o$. This is desirable in the case of proton imaging to improve the signal-to-noise ratio of the NMR signals. In the case of spectroscopy, however, this is a necessity, since some of the chemical species studied (e.g., phosphorus and carbon) are relatively scarce in the body, so that a high magnetic field is necessary in order to detect usable signals. As is evident from the Larmor equation, the increase in magnetic field B is accompanied by a corresponding increase in frequency and, hence, in the required resonant frequency of the transmitter and receiver coils. This complicates the design of RF coils which are large enough to accommodate the human body. One source of difficulty is that he RF field generated by the coil must be homogeneous over the body region to be studied to produce more uniform measurements and images. The production of uniform RF magnetic fields over large volumes becomes increasingly difficult at high frequencies owing to unwanted effects of stray capacitances between different parts of RF coils and between RF coils and surrounding objects or the NMR sample, itself, which limit the highest frequency at which the coil can be made to resonate.

Rf coils which produce substantially homogeneous fields at high frequencies throughout large volumes have been designed. Such coils are disclosed, for example, in U.S. Pat. No. 4,680,548 for use in whole body imaging of hydrogen nuclei at 1.5 Tesla, and U.S. Pat. No. 4,799,016 for use as a local coil in imaging both hydrogen and phosphorous nuclei at 1.5 Tesla. While such coils are capable of producing a homogeneous RF field within their central region of interest when no subject is present, they do not produce a homogeneous RF field when a typical subject is located in the region of interest.

The lack of RF field homogeneity in the subject is due to the fact that the subject has conductivity ($\sigma$) and permittivity ($\epsilon$) which are much greater than that of air ($\sigma_o = 0$, $\epsilon_o = 8.854 \times 10^{-12}$ farad/m). The effects caused by conductivity ($\sigma$) are well understood as explained in "Comparison of Linear and Circular Polarization for Magnetic Resonance Imaging" by G. H. Glover et al. in *Journal of Magnetic Resonance* 64, 255–270 (1985). Due to this conductivity, eddy currents are induced in the subject by the applied RF magnetic field, and these eddy currents in turn produce an RF magnetic field which adds to that produced by the RF coil. The result is a nonhomogeneous RF field in which the field strength varies as a function of distance around the central axis. As a result, images are produced in which bright areas appear in two quadrants and dark areas appear in the other two quadrants. The well-known solution to this problem is to employ quadrature excitation and reception which rotates the $B_1$, RF field in the transverse plane to even out the nonhomogeneities due to eddy currents.

Prior RF coil designs also produce a nonhomogeneous RF field in the subject as a result of the high permittivity ($\epsilon$) of the subject relative to air. The wavelength of the RF field is shortened in the subject and this produces a standing wave in which the RF field strength varies as a function of radial distance. At 1.5 Tesla, for example, the standing wave produced in the torso of a human subject peaks along the central axis of the imager to produce a bright area in the reconstructed image. At higher field strengths and RF frequencies, the standing wave cycles between peaks and valleys as a function of radial distance from the central axis, and the resulting image has a series of dark and bright rings (axial view) or stripes (sagittal or coronal view). These variations in image brightness can make diagnosis difficult or even impossible in some circumstances.

SUMMARY OF THE INVENTION

The present invention is an improved RF coil design in which radial variations in field strength are reduced by inserting a high permittivity material between the RF coil and a surrounding shield. More specifically, the RF coil assembly includes a substantially circular, cylindrical coil disposed about a central axis, cylindrical shield disposed about the cylindrical coil and concentric therewith to form an annular space there between, and a high dielectric material disposed in the annular space and having a permittivity which is selected to reduce variations in RF field strength within a subject disposed along the central axis.

A general object of the invention is to reduce the radial variations in RF field strength within the subject under study. It has been discovered that if the permittivity of the dielectric material disposed between the RF coil and its surrounding shield is increased substantially above the permittivity of air, the undesired increase in RF field strength in the center of the subject can be reduced. Variations in RF field strength due to the permittivity of the subject can thus be substantially reduced with a consequent improvement in image quality.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 1:
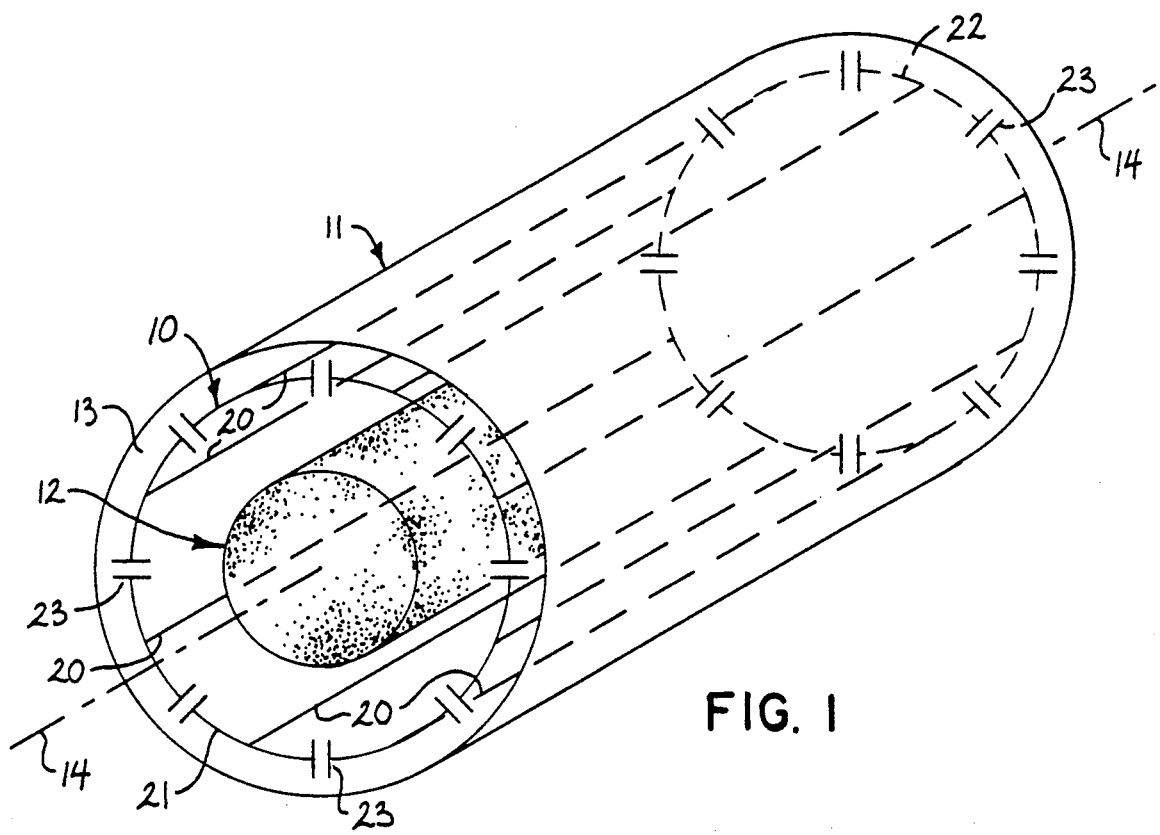
FIG. 1 is a pictorial view of a coil assembly which employs the present invention.

The propagation of electromagnetic radiation in matter is governed by Maxwell's equations. In differential form and for unbounded, linear isotropic media, they are $$\nabla \cdot \vec{D} = \rho \tag{1}$$

$$\nabla \cdot \vec{B} = 0$$

$$\nabla \times \vec{E} = -\frac{\partial \vec{B}}{\partial t}$$

$$\nabla \times \vec{H} = J + \frac{\partial \vec{D}}{\partial t}$$

where $\rho$ is the charge density and $\vec{J}$ is the current density. The electric displacement, $\vec{D}$, and the magnetic field, $\vec{H}$, are related to the electric field, $\vec{E}$, and the magnetic induction, $\vec{B}$, by the constitutive relations.

$$\vec{E} = \frac{\vec{D}}{\epsilon} \tag{2}$$

$$\vec{B} = \mu \vec{H} \tag{3}$$

where $\epsilon$ and $\mu$ are the permittivity and permeability of the media respectively. In biological material in which the magnetic susceptibility, $\chi$, is small, it is permitted to assume that $\mu = \mu_0$, the free-space value. In MKSA units this is $\mu_0 = 4\pi \times 10^{-7}$ henry/m. The permittivity of a medium is related to its free-space value by the relative dielectric constant, $\epsilon_r = \epsilon/\epsilon_0$, where $\epsilon_0 = 8.854 \times 10_{12}$ farad/m. The current density is related to $\vec{E}$ by Ohm's Law throughout the conductivity, $\sigma$, of the material by $\vec{J} = \sigma \vec{E}$.

In an NMR experiment where the applied RF field varies sinusoidally with a frequency of $\omega$, the electric and magnetic components can be separated into spatial and time parts.

$$\vec{E}(\vec{r},t) = \vec{E}(\vec{r}) e^{j\omega t} \tag{4}$$

$$\vec{B}(\vec{r},t) = \vec{B}(\vec{r}) e^{j\omega t} \tag{5}$$

If we make the above substitutions to Eqn (1), the set of four equations reduce to the wave equations for both $\vec{E}$ and $\vec{B}$. These are in the form of vector Helmholtz equations $$\nabla^2 \vec{E} + k^2 \vec{E} = 0$$

$$\nabla^2 \vec{B} + k^2 \vec{B} = 0 \tag{6}$$

which has a general solution in the form of a travelling wave, $e^{-j\vec{k}\cdot\vec{r}}$. In the above equations, k is the propagation constant. Its value is a function of the permittivity and conductivity of the medium and is expressed as $$k^2 = \omega^2 \mu \epsilon - j\omega\mu\sigma. \tag{7}$$

If the media has zero conductivity, k is real and the RF field varies sinusoidally in space without loss. On the other extreme, if the real part of k→0, and $\sigma \neq 0$, the RF field is a damped exponential function with increasing depth. The deeper into the subject, the greater the attenuation of the field amplitudes. This attenuation is characterized by the penetration or skin depth denoted by $\delta$. The variable, $\delta$, is defined as the depth at which the RF amplitude is reduced to 1/e (or 37%) of its initial value for a plane wave impinging on a planar boundary:

$$\delta = \sqrt{\frac{2}{\mu\omega\sigma}} \qquad (8)$$

Although the expression for the skin depth is different for the fields in a cylindrical object due to a circular cylindrical RF coil, Eqn. (8) is nevertheless a useful, simple measure of the attenuation as a function of frequency and conductivity. The exponential reduction of the RF amplitude due to tissue conductivity is sometimes referred to as the conductivity effect on, or contribution to RF nonhomogeneity.

The part played by the dielectric constant or permittivity of tissue is complementary to that of conductivity. A non-zero dielectric constant supports a standing wave between the interface boundaries. The wavelength of these standing waves is inversely proportional to the frequency of the RF. At low frequencies, the wavelength of the standing waves is large in comparison to body dimensions. Variations in a slowly sinusoidally changing function over a small region are, for all practical purposes, insignificant. However, at higher frequencies where the wavelength becomes shorter, these variations begin to be apparent.

The RF wavelength in a high dielectric constant material is much shorter than the wavelength of materials with low $\epsilon_r$. Since human tissue consists mostly of water, $\epsilon_r$ may be assumed to be about 75. This is approximately the relative dielectric constant of water where $\epsilon_r = 78$. However, to account for the fact that the body is nonhomogeneous, an effective $\epsilon_r$ of 58 is a reasonable approximation.

The contribution of the dielectric constant to RF nonhomogeneity is better explained if we consider solutions to the vector Helmholtz equations subject to boundary conditions. These boundary conditions are derived from the integral form of Maxwell's equations and provide information about the continuity or discontinuity of the normal and tangential field components across an interface. The conditions on the normal components at the surface of a boundary are $$(\vec{D}_2 - \vec{D}_1) \cdot \hat{n} = \rho_{sur} \qquad (9)$$

$$(\vec{B}_2 - \vec{B}_1) \cdot \hat{n} = 0 \qquad (10)$$

where $\hat{n}$ is the unit vector normal to the surface from region 1 to region 2, and $\rho_{sur}$ is the surface change density. Similarly, the conditions on the tangential components are given by $$\hat{n} \times (\vec{E}_2 - \vec{E}_1) = 0 \qquad (11)$$

$$\hat{n} \times (\vec{H}_2 - \vec{H}_1) = \vec{K} \qquad (12)$$

where $\vec{K}$ is the surface current density. For biological materials with a small but finite conductivity, $\vec{K} = 0$. Thus, the tangential component of $\vec{H}$ is continuous across the boundary in this particular case.

The basic effects of permittivity and conductivity can be best demonstrated in a simple one-dimensional slab model. Consider solutions to a one-dimensional model in the x direction, where a 30-cm-wide slab of tissue is placed in an RF field generated between two infinite, parallel current sheets located at $x = \pm 30$ cm. In this case, for a unit current density into and out of the page (along the y axis), at $x = -30$ cm and $x = +30$ cm respectively, the $\vec{B}_1$ field is in the vertical, z direction. If we neglect the finite wavelength effects of air, i.e., assume that $k \approx 0$ outside of the slab, the RF field amplitude is constant everywhere outside of the slab.

Expanding this model, consider first the case in which conductivity dominates. For $\epsilon = 1$ and $\sigma = 1.0$ S/m, the RF field is attenuated toward the center of the slab. An MR image of such an object would show a void or central region of low signal intensity. On the other hand, if permittivity dominates (where $\sigma = 0$ and $\epsilon_r = 75$), standing waves are set up in the slab. At 64 MHz where the half-wavelength is about 27 cm, roughly the size of the average human torso, MR images would show a region of high intensity or a hump at the center. The wavelength, given as $$\lambda = \frac{1}{f\sqrt{\epsilon\mu}}, \qquad (13)$$

gets much shorter at higher frequencies. At a field strength of 4.0 tesla (170 MHz), at least three and a half wavelengths fit into the 30-cm-wide slab. Axial images obtained at this frequency demonstrate a multiple ring or bull's eye-type artifact.

If we combine the effects due to conductivity and permittivity, for some particular values of $\epsilon$ and $\sigma$, these effects could cancel each other out, yielding an almost uniform field distribution. However, in the human body, where $\epsilon_r \approx 75$ and $\sigma \approx 0.3$ S/m, the effects due to the permittivity tend to dominate. The conductivity of tissue marginally attenuates the RF amplitudes, but it is the dielectric effect which increases the field amplitude at the center, forming a central hump in the field profile. At higher frequencies, the contributing effects are impediments for imaging not only the torso but the head as well.

While it might appear that there are no physical methods of eliminating field nonhomogeneity in the subject under study, since it is governed by Maxwell's equations, the present invention utilizes Maxwell's equations to solve the problem. This is accomplished not by violating laws of physics, but rather by manipulating the boundary conditions, or to be more precise, by varying the dielectric material occupying the coil-to-shield space.

DESCRIPTION OF THE PREFERRED EMBODIMENT

FIG. 1 illustrates a coil assembly which employs a so-called "high-pass" coil 10 which is surrounded by a solid metal shield 11. The coil 10 is comprised of a set of linear conductive elements 20 which extend in the axial direction and which are spaced equidistantly from each other around the inner surface of the shield 11. Circular conductors 21 and 22 are positioned at each end of the coil 10 and they connect the respective ends of the linear conductors 20 to form a structure which is referred to in the art as a "birdcage" coil. Capacitors 23 are inserted in each segment of the circular conductors 21 and 22, and these are used to tune the coil. When driven by an RF signal source (not shown), the coil 10 produces an RF magnetic field which fills the cylindrical space occupied by the subject and which is directed transversely to the central axis 14. As disclosed in the above U.S. Pat. No. 4,680,548, this coil 10 can be driven by a polyphase RF signal source in such a manner that the transverse RF field rotates about the central axis 14 to produce what is known in the art as a circularly polarized RF excitation field.

A body, or subject under study 12 is disposed in the cylindrical cavity formed by the coil 10 and there is an annular space 13 between the coil 10 and the shield 11. For the high-pass coil 10, the current density which produces the RF field is a function of the RF propagation wavelength in the direction of the z axis 14:

$$\vec{J}(\theta) = J_0 \sin(\theta) e^{-jk_z \hat{z}} \quad (14)$$

where $k_z$ is the axial propagation constant and $\theta$ is the circumferential location in degrees of the linear conductor 20. A $\cos(\theta)$ current distribution may also be used. By changing the dielectric material in the annular space 13 the propagation characteristics of the high-pass coil 10 are modified by changing the value of $k_z$.

The solution to Maxwell's equations for the coil assembly of FIG. 1 indicates that the shape of the standing wave in the subject 12 that is responsible for the radial variations in RF field strength is a function of the radial propagation constant $k_p$. A smaller radial propagation constant $k_p$ improves the homogeneity of the RF field in the radial direction by increasing the wavelength of this standing wave.

The radial propagation constant $k_p$ is in turn a function of the value of the axial propagation constant $k_z$ discussed above and the propagation constant k of the subject:

$$k_p^2 = k^2 - k_z^2 \quad (15)$$

The propagation constant k in the subject 12 is given as $$k^2 = \omega^2 \mu \epsilon - j\omega\mu\sigma, \quad (16)$$

where $\epsilon$ and $\mu$, respectively, denote the permittivity and conductivity of the subject 12. From equation 15, it is clear that a smaller value of $k_p$ is obtained by increasing the axial propagation constant $k_z$, and that the RF field homogeneity in the radial direction can thus be improved.

Figure 2:
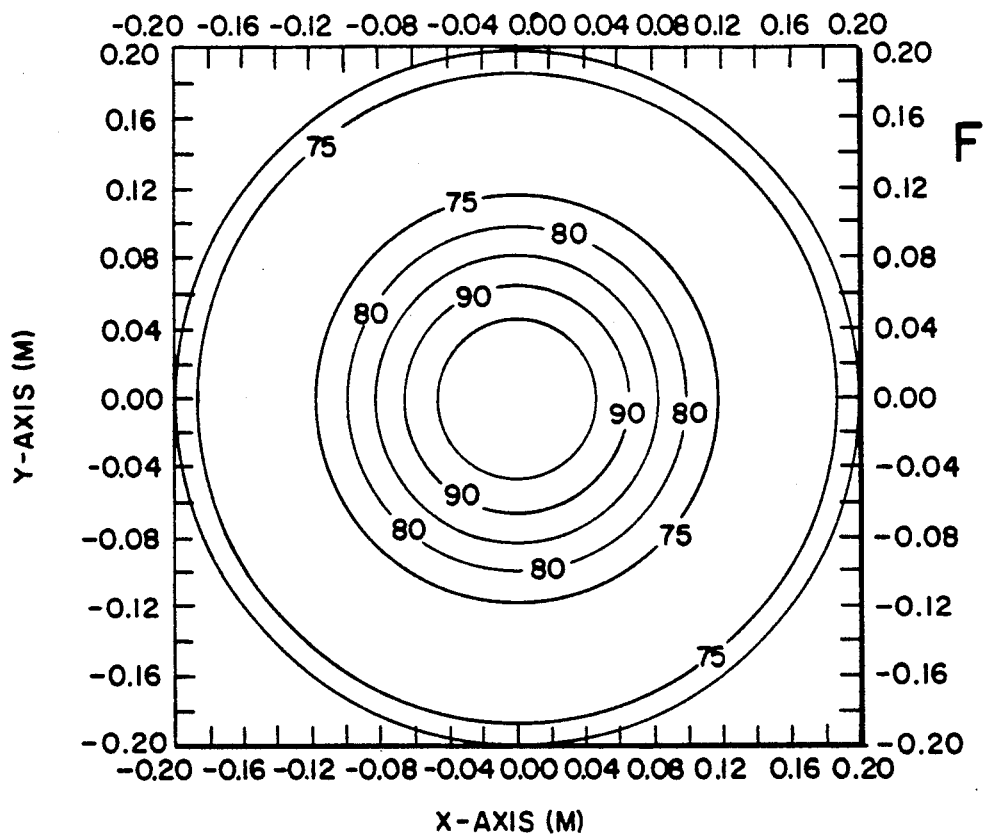
FIGS. 2, 3, 4, and 5 are graphic representations of the RF field strength taken along a transverse plane through the center of the coil assembly of FIG. 1. These graphs show the effect on RF field homogeneity as a function of the relative permittivity of a dielectric material used according to the present invention.
Figure 3:
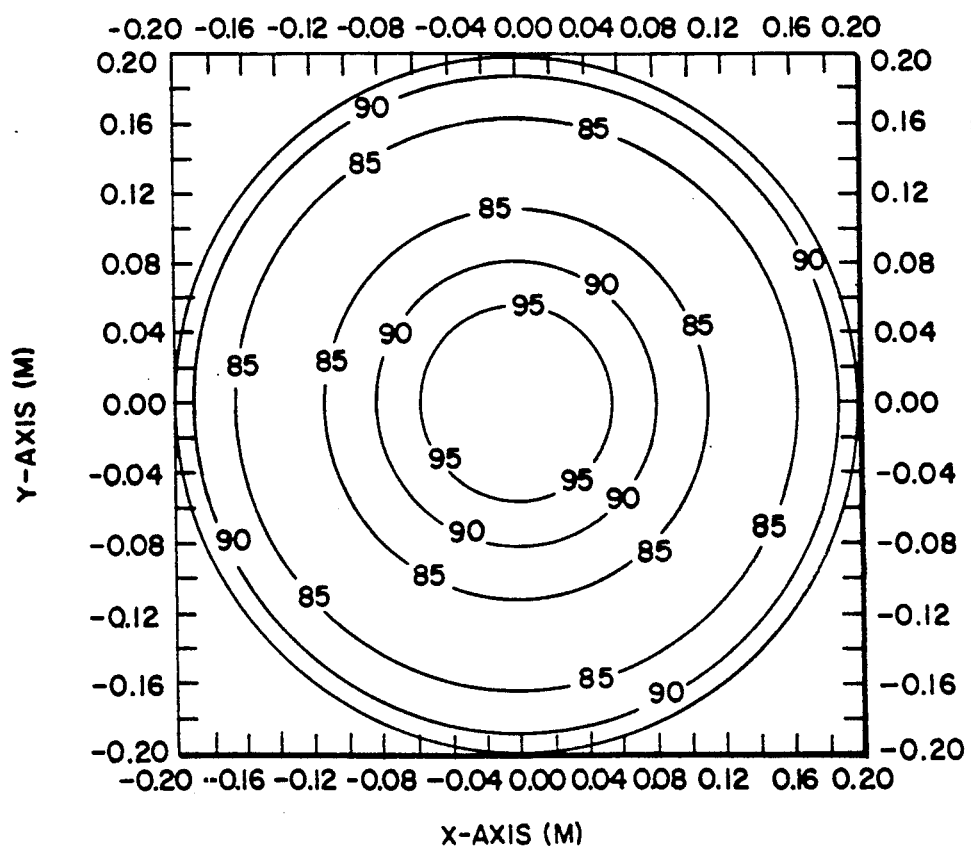
Figure 4:
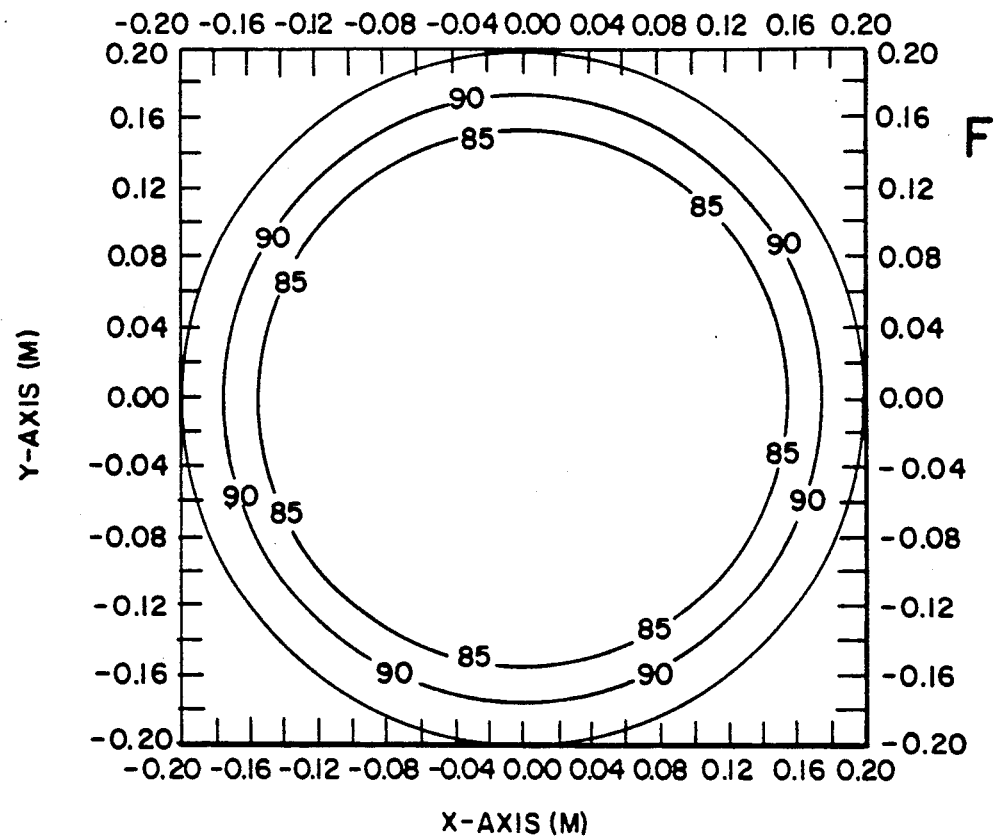
Figure 5:
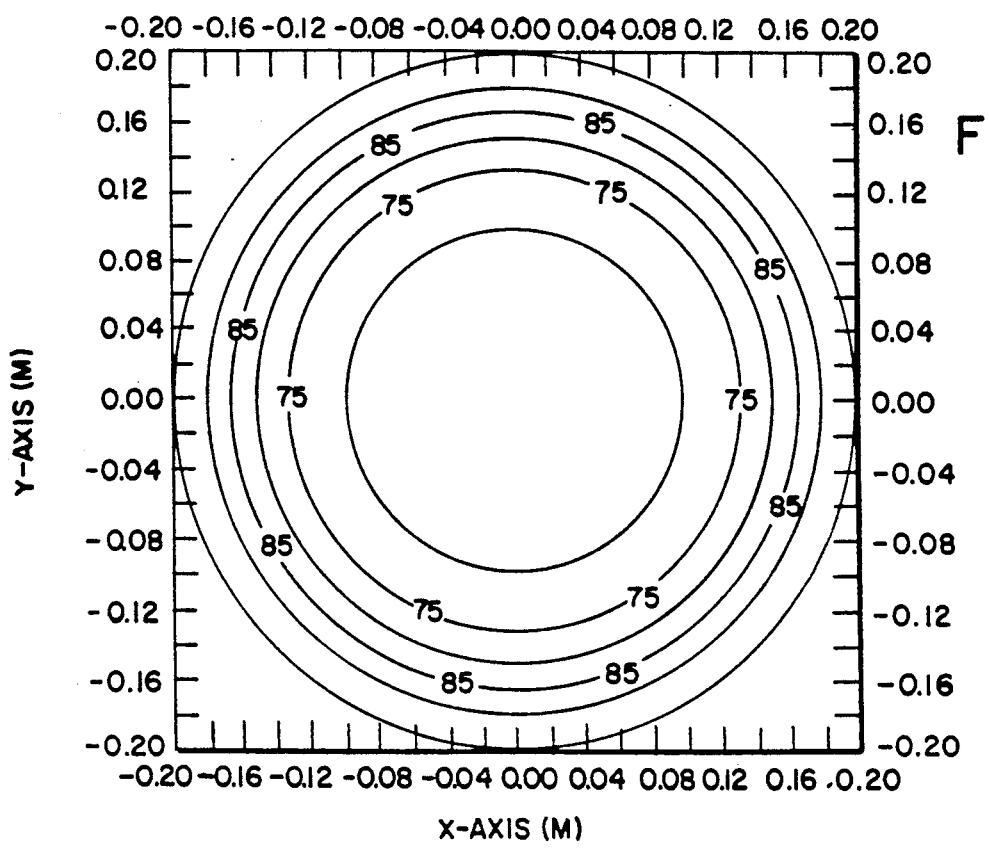

FIGS. 2-5 are contour lines which show the RF magnetic field intensity of a circularly polarized $B_1$ field in a transverse plane through the center of the coil assembly (i.e. at $z=0$). These fields were produced by a low-pass coil 10 having a radius of 0.275 meters operating at 64 MHz. The shield 11 has a radius of 0.325 meters and a long lossy dielectric cylinder phantom having a radius of 0.20 meters was employed to simulate a human subject. In FIG. 2 the annular space 13 is filled with air ($\epsilon_r = 1$), in FIG. 3 the annular space 13 is filled with a dielectric material having a relative permittivity $\epsilon_r = 20$, in FIG. 4 the dielectric material has a relative permittivity of 40, and in FIG. 5 the dielectric material has a relative permittivity of 60. The variations in RF field strength due to the permittivity effect diminish as the relative permittivity in the annular space 13 increases. At a value of between 20 and 40, the field strength variation is reduced from approximately 30% to approximately 5% in a central region of interest having a diameter of 30 cm. Further increases in the relative permittivity beyond 40 increases the attenuation of the RF field with a consequent reduction in RF field strength and only a minimal improvement in homogeneity. Therefore, the optimal relative permittivity for the dielectric material is in the range $20 \leq \epsilon_r \leq 40$.

Figure 6:
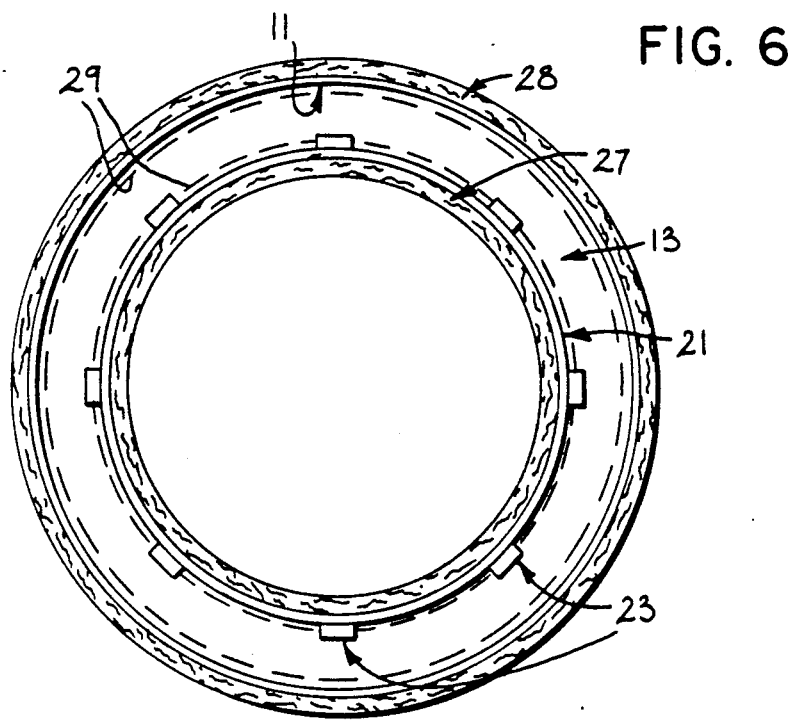
FIG. 6 is a pictorial view of the coil assembly of FIG. 1 as seen along its central axis.

Referring particularly to FIG. 6, in one preferred embodiment of the invention the RF coil 10 is formed on the outer surface of a cylindrical fiber-glass form 27 and the shield 11 is formed on the inner surface of an outer cylindrical shaped fiber-glass form 28. The annular space 13 is filled with a thin-walled polyethylene sack 29 that contains a mixture of distilled water and isopropanol. Isopropanol has a relative permittivity of approximately 18 and the relative permittivity of water is 78. By changing the ratio of water and isopropanol and the thickness of the polyethylene sack 29, the effective relative permittivity can be set to a range of values. For example, if the thickness of the polyethylene sack 29 occupies 5% of the annular space 13 and it is filled with distilled water, the effective relative permittivity is approximately 30.

In the alternative, solid dielectric materials can be shaped to fit in the annular space 13. One such material which is sold under the trademark "STYCAST" by Emerson and Cumming, Inc. has a relative permittivity of 30.

We claim:

1. An RF coil assembly for an NMR instrument, the combination comprising:
   a cylindrical coil disposed around a central axis and defining a cylindrical cavity into which a subject to be examined is subjected to a transversely directed RF field produced by the coil;
   a cylindrical shield disposed concentrically around the cylindrical coil and spaced outward therefrom to define an annular space between an outer surface of the cylindrical coil and an inner surface of the shield; and
   a dielectric material disposed in the annular space to increase the permittivity of the annular space to a value which is substantially greater than the permittivity of air and to thereby increase the radial homogeneity of the RF field produced in the subject being examined.

2. The RF coil assembly as recited in claim 1 in which the permittivity of the annular space is adjusted to a value between 20 and 40 times the permittivity of air.

3. The RF coil assembly as recited in claim 1 in which the cylindrical coil is comprised of a set of linear conductors that extend in the direction of the central axis and which are spaced radially outward therefrom and distributed around the central axis.

4. The RF coil assembly as recited in claim 3 in which the ends of said linear conductors are joined together by a pair of circular conductors that are spaced apart and concentric about the central axis.

* * * * *